United States Patent
Deng et al.

(10) Patent No.: US 12,483,262 B2
(45) Date of Patent: Nov. 25, 2025

(54) FLASH-SAR ADC CONVERSION METHOD AND CIRCUIT

(71) Applicant: HUNAN GREAT-LEO MICROELECTRONICS CO., LTD., Hunan (CN)

(72) Inventors: Huan Deng, Hunan (CN); Chaofeng Zhu, Hunan (CN); Jinbo Tang, Hunan (CN); Yanggui Luo, Hunan (CN); Chaoxiong Dai, Hunan (CN); Rui Long, Hunan (CN); Guangyao Li, Hunan (CN); Guangqiang Yan, Hunan (CN)

(73) Assignee: HUNAN GREAT-LEO MICROELECTRONICS CO., LTD., Hunan (CN)

( * ) Notice: Subject to any disclaimer, the term of this patent is extended or adjusted under 35 U.S.C. 154(b) by 0 days.

(21) Appl. No.: 18/685,504

(22) PCT Filed: Jun. 30, 2023

(86) PCT No.: PCT/CN2023/105173
§ 371 (c)(1),
(2) Date: Feb. 22, 2024

(87) PCT Pub. No.: WO2024/103794
PCT Pub. Date: May 23, 2024

(65) Prior Publication Data
US 2025/0132768 A1   Apr. 24, 2025

(30) Foreign Application Priority Data

Nov. 14, 2022   (CN) ......................... 202211418546.X

(51) Int. Cl.
*H03M 1/38*   (2006.01)
*H03M 1/36*   (2006.01)

(52) U.S. Cl.
CPC ............. *H03M 1/38* (2013.01); *H03M 1/361* (2013.01)

(58) Field of Classification Search
CPC ............ H03M 1/38; H03M 1/42; H03M 1/12; H03M 1/361
(Continued)

(56) References Cited

U.S. PATENT DOCUMENTS 9,362,939 B1 *   6/2016   Rath ...................... H03M 1/145
11,290,121 B2 *   3/2022   Konno ................ H03M 1/0809
(Continued)

FOREIGN PATENT DOCUMENTS

| CN | 106209102 | 12/2016 |
| CN | 111464186 | 7/2020 |
| CN | 115473533 | 12/2022 |

OTHER PUBLICATIONS

"International Search Report (Form PCT/ISA/210) of PCT/CN2023/105173", mailed on Aug. 24, 2023, pp. 1-4.
(Continued)

*Primary Examiner* — Peguy Jean Pierre
(74) *Attorney, Agent, or Firm* — JCIPRNET

(57) ABSTRACT

A FLASH-SAR ADC conversion method comprises: at a sampling stage of a FLASH-SAR ADC, sampling an input signal by a SAR ADC module, and at the same time, performing amplification, comparison and high-bit coarse quantization on the input signal by a FLASH ADC module to output a FLASH ADC conversion result, wherein the FLASH ADC conversion result is a temperature code; at a conversion stage of the FLASH-SAR ADC, performing fine quantization on a residual voltage by the SAR ADC module according to the temperature code and the input signal to output a SAR ADC conversion result, and at the same time, sampling a reference voltage or a partial voltage of the
(Continued)

reference voltage by FLASH ADC module; and performing encoding on the temperature code and the SAR ADC conversion result to obtain a signal conversion result of the FLASH-SAR ADC.

8 Claims, 10 Drawing Sheets

(58) Field of Classification Search
USPC .................................. 341/161, 155, 144, 143
See application file for complete search history.

(56) References Cited

U.S. PATENT DOCUMENTS

| | | |
|---|---|---|
| 12,107,593 B2 * | 10/2024 | Kwon .................... H03M 1/468 |
| 2012/0154193 A1 | 6/2012 | Chang et al. |
| 2017/0093418 A1 * | 3/2017 | Baek ..................... H03M 1/466 |

OTHER PUBLICATIONS

"Written Opinion of the International Searching Authority (Form PCT/ISA/237) of PCT/CN2023/105173", mailed on Aug. 24, 2023, pp. 1-4.
Jinghao Lv, "Design of High Speed ADC Based on Flash-SAR Structure," Master's thesis, Mar. 20, 2022, Department of Electronic Science and Technology, University of Electronic Science and Technology of China.
Yudong Ouyang, "Design of high speed hybrid-SAR ADCs," Master's thesis, Apr. 20, 2021, Department of Information Science & Electronic Engineering, Zhejiang University.

* cited by examiner

FLASH-SAR ADC CONVERSION METHOD AND CIRCUIT

CROSS-REFERENCE OF RELATED APPLICATION

This application is a 371 of international application of PCT application serial no. PCT/CN2023/105173, filed on Jun. 30, 2023, which claims the priority benefit of China application no. 202211418546.X, filed on Nov. 14, 2022. The entirety of each of the above-mentioned patent applications is hereby incorporated by reference herein and made a part of this specification.

TECHNICAL FIELD

The invention belongs to the technical field of analog-to-digital conversion circuits, and relates to a FLASH-SAR ADC conversion method and circuit.

DESCRIPTION OF RELATED ART

Analog-to-digital converters (ADC), as a bridge for linking analog signals and digital signals, can convert analog signals in the nature into digital signals that can be processed by a digital system, thus being applied to many fields. With the development of technology, the demand of users for ADCs is becoming increasingly larger. Successive Approximation Register (SAR) ADC circuits are widely used because of their simple structure, low power, small area and other advantages. However, traditional SAR ADCs can only obtain the result of one bit within one conversion clock, so N-bit ADCs need N clocks, which severely limits the conversion speed of the SAR ADCs.

With the continuous improvement of the process, good process compatibility makes it possible to obtain a high conversion speed of SAR ADCs, but there are still some limitations due to the serial operating mechanism of the SAR ADCs. To overcome the limitations caused by serial operation of SAR ADCs, a processing method commonly used at present is to adopt an all parallel ADC (FLASH ADC) and SAR ADC hybrid structure, and the "parallel" operating mode of FLASH ADCs is added to shorten the number of conversion cycles of the entire ADC to shorten the total time consumed for successive approximation, so as to increase the conversion speed of the entire ADC. One conversion process of a common FLASH-SAR ADC may have three stages, and the working principle of the FLASH-SAR ADC is as follows:

1. Sampling stage: a FLASH ADC and a SAR ADC sample an input signal synchronously.
2. FLASH ADC quantization stage: after sampling is ended, the SAR ADC enters a hold stage, the FLASH ADC starts to work to quantize high bits (for example, M bits) and completes comparison in one cycle (or more cycles, which depends on the structure of the FLASH ADC) to provide digital code of the M high bits; then, the digital codes of the M bits are transmitted to the SAR ADC to obtain a quantized voltage $V_{Flash}$.
3. SAR ADC quantization stage: the FLASH ADC transmits the result to the SAR ADC to obtain a residual voltage $V_{residue}=V_{in}-V_{Flash}$, then the SAR ADC fine quantizes the residual voltage $V_{residue}$ to obtain digital codes of low bits (N-M bits). However, in the implementation process of the invention, the inventor finds that the above-mentioned traditional FLASH-SAR ADC processing method still has the technical problem of low conversion efficiency.

SUMMARY

In view of the problem of the above-mentioned traditional method, the invention provides a FLASH-SAR ADC conversion method and a FLASH-SAR ADC circuit, which can greatly improve the conversion efficiency and reduce errors caused by the aperture time and other undesired factors.

To fulfill the above purpose, the embodiments of the invention adopt the following technical solution:

In one aspect, the invention provides a FLASH-SAR ADC conversion method, comprising:

At a sampling stage of a FLASH-SAR ADC, sampling an input signal by a SAR ADC module, and at the same time, performing amplification, comparison and high-bit coarse quantization on the input signal by a FLASH ADC module to output a FLASH ADC conversion result, wherein the FLASH ADC conversion result is a temperature code;

At a conversion stage of the FLASH-SAR ADC, performing fine quantization on a residual voltage by the SAR ADC module according to the temperature code and the input signal to output a SAR ADC conversion result, and at the same time, sampling a reference voltage or a partial voltage of the reference voltage by the FLASH ADC module; and Performing encoding on the temperature code and the SAR ADC conversion result to obtain a signal conversion result of the FLASH-SAR ADC.

In the other aspect, the invention further provides a FLASH-SAR ADC circuit, comprising a FLASH ADC module and a SAR ADC module, wherein a sampling input terminal of the FLASH ADC module allows an input signal and a reference voltage to be input thereto, an output terminal of the FLASH ADC module is connected to an input terminal of a CDAC circuit of the SAR ADC module and is also connected to a digital processing module, a sampling input terminal of the SAR ADC module allows the input signal and the reference signal to be input thereto, and an output terminal of the SAR ADC module is connected to the digital processing module;

At a sampling stage of the FLASH-SAR ADC circuit, the SAR ADC module samples the input signal, and at the same time, the FLASH ADC module performs amplification, comparison and high-bit coarse quantization on the input signal to output a FLASH ADC conversion result, wherein the FLASH ADC conversion result is a temperature code;

At a conversion stage of the FLASH-SAR ADC circuit, the SAR ADC module performs fine quantization on a residual voltage according to the temperature code and the input signal to output a SAR ADC conversion result, and at the same time, the FLASH ADC module samples the reference voltage or a partial voltage of the reference voltage; and encoding is performed on the temperature code and the SAR ADC conversion result to obtain a signal conversion result of the FLASH-SAR ADC circuit.

One of the above-mentioned technical solutions has the following advantages and beneficial effects:

According to the FLASH-SAR ADC conversion method and circuit, at the sampling stage of the FLASH-SAR ADC circuit, when the SAR ADC module samples an input signal, the FLASH ADC module performs amplification, comparison and high-bit coarse quantization on the input signal to output a FLASH ADC conversion result in the form of a temperature code. The conversion stage is started when the sampling stage is ended, and at the conversion stage of the FLASH-SAR ADC circuit, the SAR ADC module performs fine quantization on a residual voltage according to the temperature code and the input signal to output a SAR ADC conversion result, and at the same time, the FLASH ADC module samples a reference voltage or a partial voltage of the reference voltage. In this way, the operating sequence of the FLASH-SAR ADC is optimized, and FLASH ADC quantization is completed at the same time as ADC sampling and will not occupy an independent clock cycle, thus increasing the conversion speed of the entire ADC and reducing errors caused by the aperture time and other undesired factors. Compared with the traditional FLASH ADC processing method, the above solution solves the problem that a waste of time is caused because the quantization of a traditional FLASH ADC occupies one or more ADC clock cycles and a SAR ADC enters the hold stage and does not work when the FLASH ADC works, thus greatly improving the conversion efficiency.

BRIEF DESCRIPTION OF THE DRAWINGS

To more clearly describe the technical solutions of the embodiments of the application or the prior art, drawings used for describing the embodiments of the application or the prior art will be briefly introduced below. Obviously, the drawings in the following description merely illustrate some embodiments of the application, and those ordinarily skilled in the art can obtain other drawings according to the following ones without creative labor.

FIG. 7A and FIG. 7B are principle diagrams of CDAC dual-mode sampling in a design example according to one embodiment, wherein FIG. 7A illustrates the sampling principle in a first reference mode, and FIG. 7B illustrates the sampling principle of a second reference mode.

DESCRIPTION OF THE EMBODIMENTS

To make the purposes, technical solutions and advantages of the application clearer, the application will be further described in detail below in conjunction with accompanying drawings and embodiments. It should be understood that the specific embodiments described below are merely used for explaining the application, and are not used for limiting the application. Unless otherwise defined, all technical and scientific terms used in this specification have the same meaning as commonly understood by those skilled in the art. The terms used in the description of the application are merely for describing specific embodiments of the application and are not intended to limit the application.

It should be noted that "embodiment" mentioned in this specification means that a specific feature, structure or characteristic described in conjunction with said embodiment may be included in at least one embodiment of the invention. The term "embodiment" used in different parts of this specification do not necessarily refer to the same embodiment, or an independent or alternative embodiment mutually conflicting with other embodiments.

Those skilled in the art can understand that embodiments described in this specification can be combined with other embodiments. The term "and/or" used in the description of the invention and the appended claims refers to any combination and all possible combinations of one or more associated items listed, and the inclusion of these combinations. It should be noted that when one element is referred to as being "connected to" the other element, it may be directly connected to and integrated with the other element or there may be an element between the two elements. Terms "one end" and "the other end" and similar expressions in this specification are merely for the purpose of description.

It can be known, from the analysis on the traditional FLASH-SAR ADC processing method, that a FLASH ADC can replace the conversion of M high bits of a SAR ADC, but the quantization of the FLASH ADC also takes time and occupies one (or more) clock cycle(s) of the ADC. When the FLASH ADC works, the SAR ADC enters the hole stage and does not work, leading to a waste of time. Such a processing method also introduces aperture errors and impacts of other undesired factors, leading to an error of a comparison result.

Figure 1:
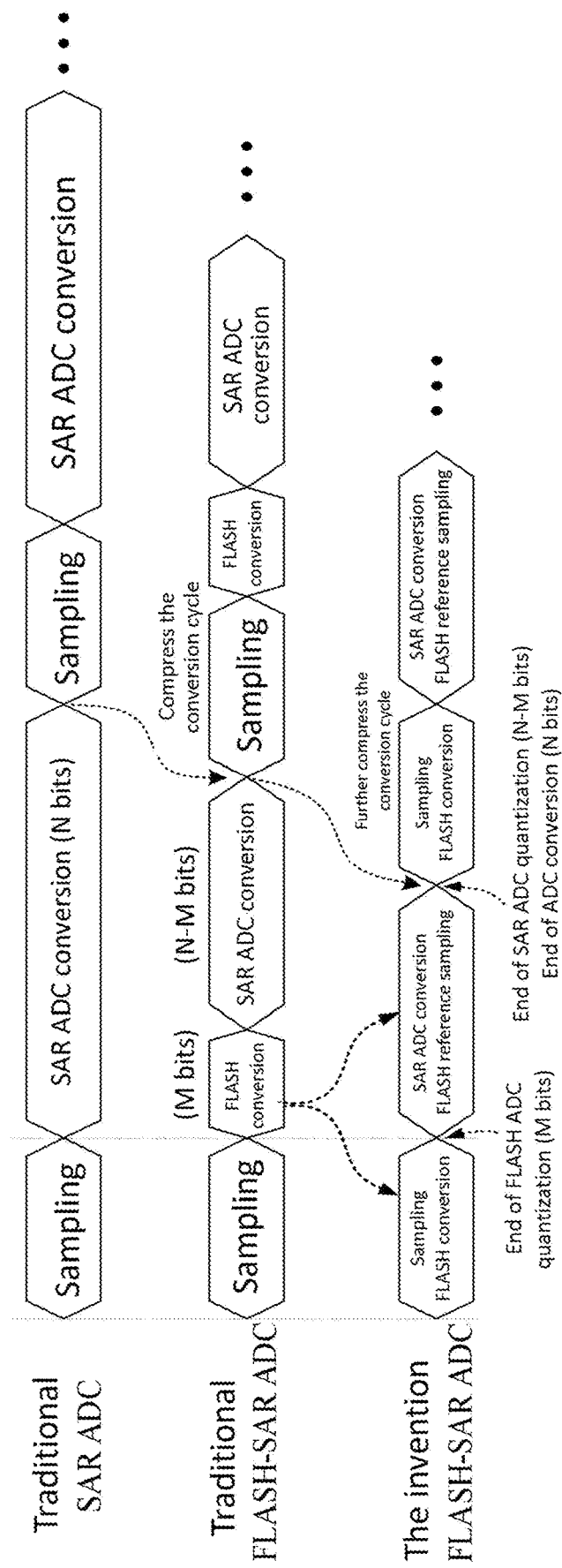
FIG. 1 is a schematic comparison diagram of the conversion sequence of a FLASH-SAR ADC in the application and the conversion sequence of traditional techniques.

In view of the above problems, the invention provides a new combined operating sequence of a FLASH-SAR ADC, as shown in FIG. 1. By adopting the new combined operating sequence and optimizing comparators of a FLASH ADC circuit, FLASH ADC quantization can be completed at the same time as ADC sampling and will not occupy an independent clock cycle, thus increasing the conversion speed of the entire ADC and reducing errors caused by the aperture time and other undesired factors.

The implementations of the invention will be described in detail below in conjunction with drawings of the embodiments of the invention.

Figure 2:
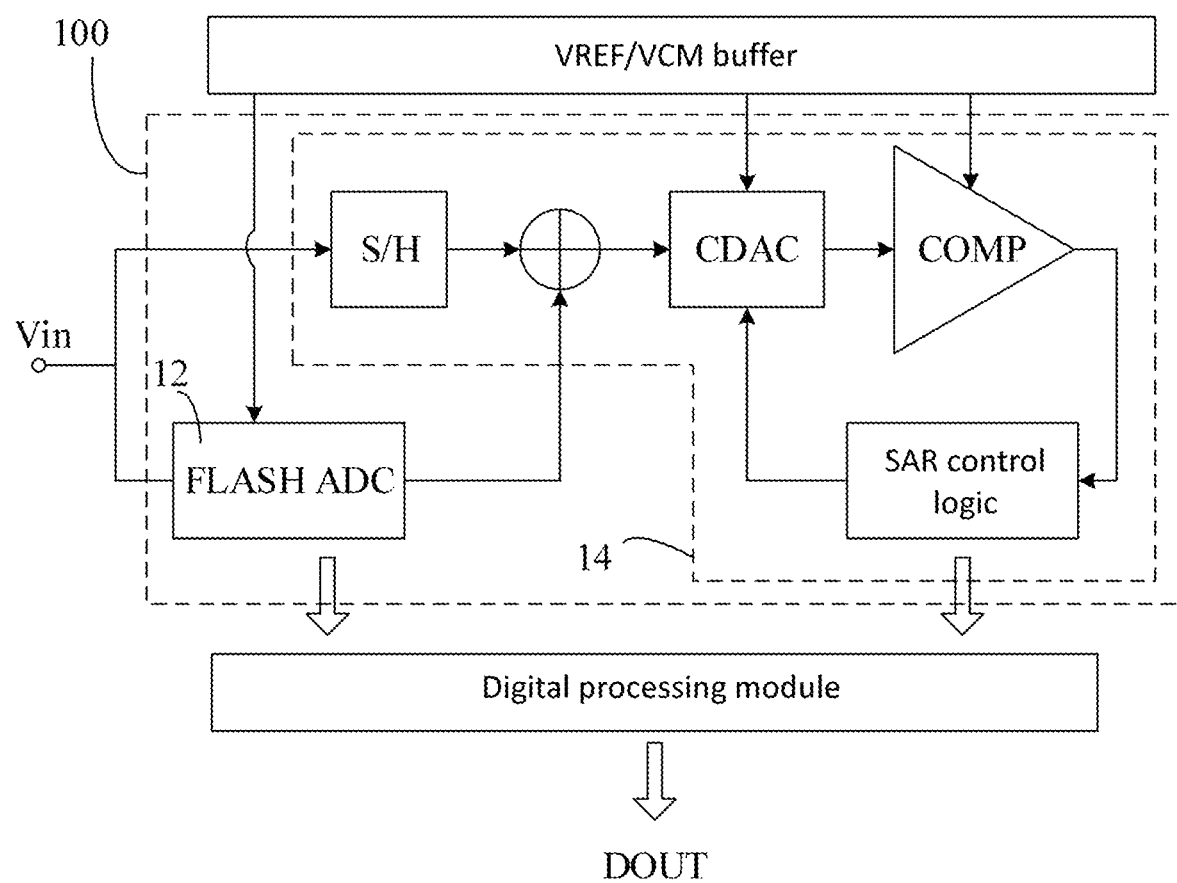
FIG. 2 is an overall ADC architecture block diagram of a FLASH-SAR ADC according to one embodiment.

One embodiment of the application provides a FLASH-SAR ADC circuit 100, the FLASH-SAR ADC architecture of which is shown in FIG. 2 and supports one, two or more reference modes. The FLASH-SAR ADC circuit 100 mainly comprises a FLASH ADC module 12 and a SAR ADC module 14. A sampling input terminal of the FLASH ADC module 12 allows an input signal and a reference voltage to be input thereto. An output terminal of the FLASH ADC module 12 is connected to an input terminal of a CDAC circuit of the SAR ADC module 14 and is also connected to a digital processing module. A sampling input terminal of the SAR ADC module 14 allows the input signal and the reference voltage to be input thereto, and an output terminal of the SAR ADC module 14 is connected to the digital processing module.

At a sampling stage of the FLASH-SAR ADC circuit 100, the SAR ADC module 14 samples the input signal, and at the same time, the FLASH ADC module 12 performs amplification, comparison and high-bit coarse quantization on the input signal to output a FLASH ADC conversion result, wherein the FLASH ADC conversion result is a temperature code.

At a conversion stage of the FLASH-SAR ADC circuit 100, the SAR ADC module 14 performs fine quantization on a residual voltage according to the temperature code and the input signal to output a SAR ADC conversion result, and at the same time, the FLASH ADC module 12 samples a reference voltage or a partial voltage of the reference voltage. Encoding is performed on the temperature code and the SAR ADC conversion result to obtain a signal conversion result of the FLASH-SAR ADC circuit 100.

It can be understood that the digital processing module is configured to perform redundant bit encoding on the temperature code and the SAR ADC conversion result to output the signal conversion result (DOUT). Generally, the FLASH ADC module 12 is internally provided with a resistor-string voltage dividing circuit, a comparator circuit, a switched capacitor circuit, and other parts, and the specific connection relationship and working relationship between these parts can be understood with reference to the architecture of the FLASH ADC module 12 in the art, wherein in order to adapt the new combined operating sequence, only the sampling input of the comparator circuit in the FLASH ADC module 12 needs to be adaptively optimized to support the new combined operating sequence. The optimal design principle of the comparator circuit of the FLASH ADC module 12 is as follows: to adapt to the new combined operating sequence, at the default stage (the reset stage, also the conversion stage of the SAR ADC module 14), the comparator circuit of the FLASH ADC module 12 samples the reference voltage; at the sampling stage, the comparator circuit of the FLASH ADC module 12 amplifies the input signal, and after sampling is ended, the FLASH ADC module 12 sends out a comparison result (in the form a temperature code). According to the value of M (the number of high bits of the ADC), at least $2^M-1$ comparator circuits need to be arranged in the FLASH ADC module 12. The FLASH ADC module 12 compares an input voltage (Vin) with a partial voltage on a resistor string (a partial voltage of the reference voltage) to obtain a result, which a FLASH ADC output result, so as to obtain M high bits of the ADC.

The circuit of the SAR ADC module 14 comprises a sampling/hold module (S/H), a CDAC module, a comparator (COMP) module, a SAR control logic module (SAR-LOGIC) and other parts, and the specific connection relationship and working relationship between these parts can be understood with reference to the architecture of the SAR ADC module 14 in the art. In the SAR ADC module 14, the CDAC module is divided into two parts, wherein a first part is a switched capacitor part corresponding to M high bits and is controlled to switch according to the conversion result (temperature code) of the FLASH ADC module 12;

a second part is a switched capacitor part corresponding to (N-M) low bits and is controlled by SAR control logic to switch according to a comparison result of the comparator (COMP) module. The CDAC module may be a traditional non-segmented CDAC or a segmented (for example, but not limited to, two-segment, three-segment or four-segment) CDAC. The CDAC module adopts bottom plates for sampling, so the bottom plate of each capacitor should be provided with at least three switches to be connected to an input voltage Vin, a reference voltage VREF/Vref and a reference ground GND respectively, and may also be connected to a common-mode voltage VCM. Required switches and the voltage to be accessed to the bottom plates can be adjusted according to different sampling methods.

Specifically, as shown in FIG. 1, the operating process of the FLASH-SAR ADC circuit 100 may be divided into two stages: a SAR ADC sampling/FLASH ADC conversion stage and a SAR ADC quantization/FLASH ADC reset stage:

1. SAR ADC sampling/FLASH ADC conversion stage: at the ADC sampling stage (sampling stage), the SAR ADC module 14 samples an input signal Vin; at the same time, the FLASH ADC module 12 performs comparison and amplification on the input signal Vin, and on the clock edge at the end of the sampling stage, a comparator in the FLASH ADC module 12 output a comparison result, which is used as a FLASH ADC conversion result.

2. SAR ADC quantization/FLASH ADC reset stage: when sampling is completed (that is, the conversion stage is started), the FLASH ADC module 12 has already provided a quantized digital code (M bits) to obtain a quantized voltage $V_{Flash}$, and then a residual voltage $V_{residue}$=Vin-$V_{Flash}$ is obtained. The SAR ADC module 14 performs fine quantization on the residual voltage $V_{residue}$ to obtain a digital code of a low bit (N-M bits). After sending out the conversion result, the FLASH ADC module 12 will enter the reset stage within a corresponding SAR ADC fine quantization time to sample a reference voltage or a partial voltage of the reference voltage to make preparation for the next time of conversion.

It should be noted that the above FLASH-SAR ADC circuit 100 shown in FIG. 2 is a single-ended input ADC, and a FLASH-SAR ADC circuit 100 of a fully differential structure can be understood in a similar way.

According to the FLASH-SAR ADC circuit 100, at the sampling stage, when the SAR ADC module 14 samples the input signal, the FLASH ADC module 12 performs amplification, comparison and high-bit coarse quantization on the input signal to output the FLASH ADC conversion result in the form of a temperature code. The conversion stage is started after the sampling stage is ended, and at the conversion stage, the SAR ADC module 14 performs fine quantization on the residual voltage according to the temperature code and the input signal to output an SAR ADC conversion result, and at the same time, the FLASH ADC module 12 samples the reference voltage or the partial voltage of the reference voltage. In this way, the operating sequence of the FLASH-SAR ADC is optimized, and FLASH ADC quantization is completed at the same time as ADC sampling and will not occupy an independent clock cycle, thus increasing the conversion speed of the entire ADC and reducing errors caused by the aperture time and other undesired factors.

Compared with the traditional FLASH-SAR ADC processing method, the above solution avoids a separate work clock of the FLASH ADC at the conversion stage, thus further shortening the conversion cycle required by the SAR ADC and increasing the conversion speed of the entire ADC. When the combined sequence is changed, the influence of aperture errors is minimized. The sequence is used reasonably to avoid a waste of time caused by an excessive waiting time of the SAR ADC, thus reducing the influence of the waiting time and other factors on the result. To sum up, the problem that a waste of time is caused because the quantization of a traditional FLASH ADC occupies one or more ADC clock cycles and a SAR ADC enters the hold stage and does not work when the FLASH ADC works is solved, thus greatly improving the conversion efficiency.

In one embodiment, when a sampling clock is valid, the SAR ADC module 14 samples an input signal. On a rising edge of the sampling clock, a comparator pre-amplifier stage in the FLASH ADC module 12 is switched from the reset state for sampling the reference voltage to an amplification state to amplify the input signal. On a falling edge of the sampling clock, the comparator pre-amplifier stage in the FLASH ADC module 12 transmits a pre-amplifier stage result to a latch in the FLASH ADC module 12 for processing, and the latch in the FLASH ADC module 12 converts and outputs an obtained comparison result by means of an RS latch in the FLASH ADC module 12 to obtain a temperature code. After transmitting the pre-amplifier stage result to the latch in the FLASH ADC module 12, the comparator pre-amplifier stage in the FLASH ADC module 12 will be switched to the reset state.

Specifically, at the ADC sampling stage, the sampling clock is at a high voltage level (for example, the high voltage level is valid, and in case of a valid low voltage level, it can be understood in a similar way except that the clock edge turns correspondingly), an external input signal Vin is input to the ADC, the SAR ADC module 14 samples the input signal Vin, and at the same time, the FLASH ADC module 12 amplifies the input signal Vin. The working principle of the FLASH ADC module 12 at this stage is as follows:

(1) On the rising edge of the sampling clock, the PRE-COMP (comparator pre-amplifier stage) in the FLASH ADC module 12 is switched from a pre-charge state (for sampling the reference voltage) to an amplification state (for amplifying the input signal Vin).

(2) On the falling edge of the sampling clock, the PRE-COMP in the FLASH ADC module 12 transmits a pre-amplifier stage result to a LATCH (latch) stage, the LATCH stage obtains a comparison result according to the pre-amplifier stage result, and the comparison result is output by the RS latch, as a FLASH ADC conversion result (in the form of a temperature code).

(3) After the pre-amplifier stage result is transmitted to the LATCH stage to be latched, the PRE-COMP clock of the comparator circuit is turned off, and the reset stage is started (for sampling the reference voltage) to make preparation for the next time of conversion. At this point, the work of the FLASH ADC module 12 in one ADC conversion stage is completed.

Through the above working process, work in the SAR ADC sampling/FLASH ADC conversion stage is efficiently completed.

In one embodiment, when the sampling clock turns invalid, a CDAC in the SAR ADC module 14 is switched to a current bit according to the temperature code. After the CDAC is switched to the current bit, and the pre-amplifier stage result based on the input signal is transmitted to a latch in the SAR ADC module 14 to be processed when a latch clock of the comparator in the SAR ADC module 14 is valid, to output a residual voltage fine quantization result of the current bit. The residual voltage fine quantization result of the current bit is fed back to a capacitor corresponding to the next bit of the CDAC in the SAR ADC module 14, and the CDAC in the SAR ADC module 14 is switched to the next bit according to the temperature code. After the CDAC is switched to the next bit, the pre-amplifier stage result based on the input signal is transmitted to the latch in the SAR ADC module 14 to be processed when the latch clock of the comparator in the SAR ADC module 14 is valid, to output a residual voltage fine quantization result of the next bit. When residual voltage fine quantization of all bits of the SAR ADC module 14 is completed, an SAR ADC conversion result is output.

Specifically, when the sampling clock turns to a low voltage level (for example, the high voltage level is valid), the FLASH ADC module 12 is in the reset state (for sampling the reference voltage), and at the same time, the SAR ADC module 14 performs fine quantization on the residual voltage. The specific working principle of the SAR ADC module 14 is as follows:

(1) At the end of sampling (on the falling edge of the sampling clock), the FLASH ADC module outputs a result, and the corresponding high bit of the CDAC of the SAR ADC module 14 is switched according to the FLASH ADC conversion result.

(2) First quantization of the SAR ADC module 14:

(2.1) After the CDAC is switched, a steady state is established, and the comparator of the SAR ADC module 14 enters a pre-amplification stage.

(2.2) When the LATCH clock of the comparator of the SAR ADC module 14 is valid, a pre-amplifier stage result is transmitted to the LATCH stage to be latched and output. At this point, quantization of the first bit of the SAR ADC module 14 is ended.

(3) Second quantization of the SAR ADC module 14:

(3.1) The result of the first quantization is fed back to the capacitor corresponding to the next bit of the CDAC, and switches of the bottom plate are switched according to the comparison result.

(3.2) After the CDAC is switched, a steady state is established, and the comparator of the SAR ADC module 14 enters the pre-amplification stage.

(3.3) When the LATCH clock of the comparator of the SAR ADC module 14 is valid, the pre-amplifier stage result is transmitted to the LATCH stage to be latched and output. At this point, quantization of the second bit of the SAR ADC module 14 is ended.

(4) Quantization of subsequent bits is the same as step (3) until SAR ADC fine quantization is completed, and a SAR ADC conversion result is obtained.

Finally, encoding is performed on the FLASH ADC conversion result and the SAR ADC conversion result to obtain an ADC output result finally. The above two stages can be performed repeatedly to realize continuous ADC conversion.

Through the above working process, work in the SAR ADC quantization/FLASH ADC reset stage is completed efficiently.

Figure 3:
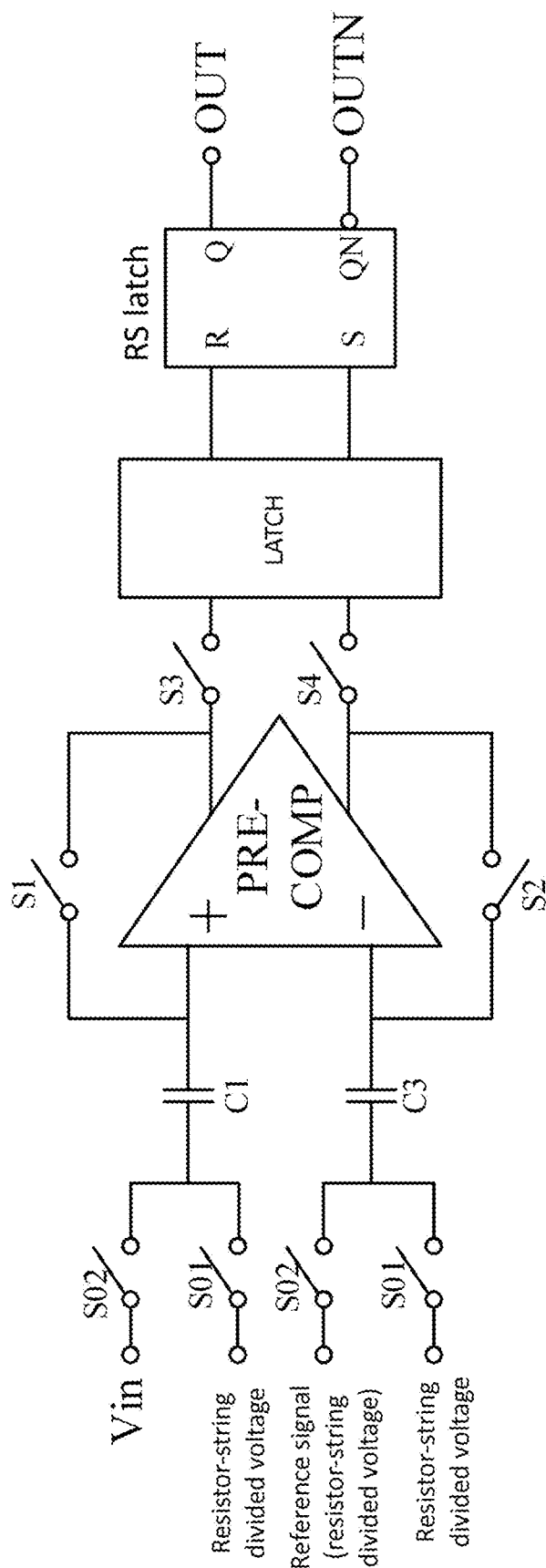
FIG. 3 is a schematic diagram of one comparator in a design example of a FLASH ADC according to one embodiment.

In one embodiment, as shown in FIG. 3, the comparator of the FLASH ADC module 12 comprises a comparator pre-amplifier stage PRE-COMP, a LATCH, an RS latch, a first pre-charge capacitor C1, a second pre-charge capacitor C3, a first switch S1, a second switch S2, a third switch S3 and a fourth switch S4.

A positive input terminal of the comparator pre-amplifier stage PRE-COMP is connected to one terminal of the first pre-charge capacitor C1, the other terminal of the first pre-charge capacitor C1 allows the input signal Vin to be input thereto or is connected to the resistor-string voltage dividing circuit. A negative input terminal of the comparator pre-amplifier stage PRE-COMP is connected to one terminal of the second pre-charge capacitor C3, the other terminal of the second pre-charge capacitor C3 allows the reference voltage (the voltage of a reference signal in FIG. 3) to be input thereto or is connected to the resistor-string voltage dividing circuit. A positive output terminal of the comparator pre-amplifier stage PRE-COMP is connected to a positive input terminal of the latch through the third switch S1, a negative output terminal of the comparator pre-amplifier stage PRE-COMP is connected to a negative input terminal of the latch through the fourth switch S4, and the latch is in cascade connection with the RS latch. One terminal of the first switch S1 is connected to the positive input terminal of the comparator pre-amplifier stage PRE-COMP, and the other end of the first switch is connected to the positive output terminal of the comparator pre-amplifier stage PRE-COMP. One terminal of the second switch S2 is connected to the negative input terminal of the comparator pre-amplifier stage PRE-COMP, and the other terminal of the second switch S2 is connected to the negative output terminal of the comparator pre-amplifier stage PRE-COMP.

Further, this embodiment provides a core circuit of the FLASH ADC module 12 (circuit design of the comparator module), which can efficiently support the operating sequence mentioned above and can also support reference modes of various voltage inputs. FIG. 3 is the design diagram of a circuit structure of one comparator in the FLASH ADC module 12, and other comparators may have the same structure.

Specifically, at the ADC sampling stage, the SAR ADC module 14 samples the input signal Vin, at this moment, the first switch S1 and the second switch S2 are kept in an off state, the third switch S3 and the fourth switch S4 are turned on, and the input signal Vin is compared and amplified by the comparator pre-amplifier stage PRE-COMP and is then sent to the LATCH and the RS latch to be sequentially processed and output. On the clock edge at the end of the sampling stage, the RS latch output a result, which is used as a FLASH ADC conversion result. When the first switch S1 and the second switch S2 are turned on, a common-mode voltage is provided for the pre-charge capacitors. Wherein, a switch S01 at an input terminal acts synchronously with the first switch S1 and the second switch S2;

A switch S02 on the input terminal acts synchronously with the third switch S3 and the fourth switch S4, and is configured to realize switching control of different reference inputs.

After ADC sampling is completed, the RS latch of the FLASH ADC module 12 has already provided a quantized digital code (M bits) to obtain a quantized voltage $V_{Flash}$, and then a residual voltage $V_{residue}=Vin-V_{Flash}$ is obtained. The SAR ADC module 14 performs fine quantization on the residual voltage $V_{residue}$ to obtain a digital code of a low bit (N-M bits). After the FLASH ADC module 12 sends out the conversion result, the comparator pre-amplifier stage PRE-COMP of the FLASH ADC module 12 enters the reset stage within a corresponding SAR ADC fine quantization time to sample a reference voltage input via the second pre-charge capacitor C3 to make preparation for the next time of conversion.

By adopting the above circuit design of the comparator module, the above operating sequence can be realized by means of a small amount of circuit design, thus improving the conversion efficiency and reducing the production cost of converter chips.

Figure 4:
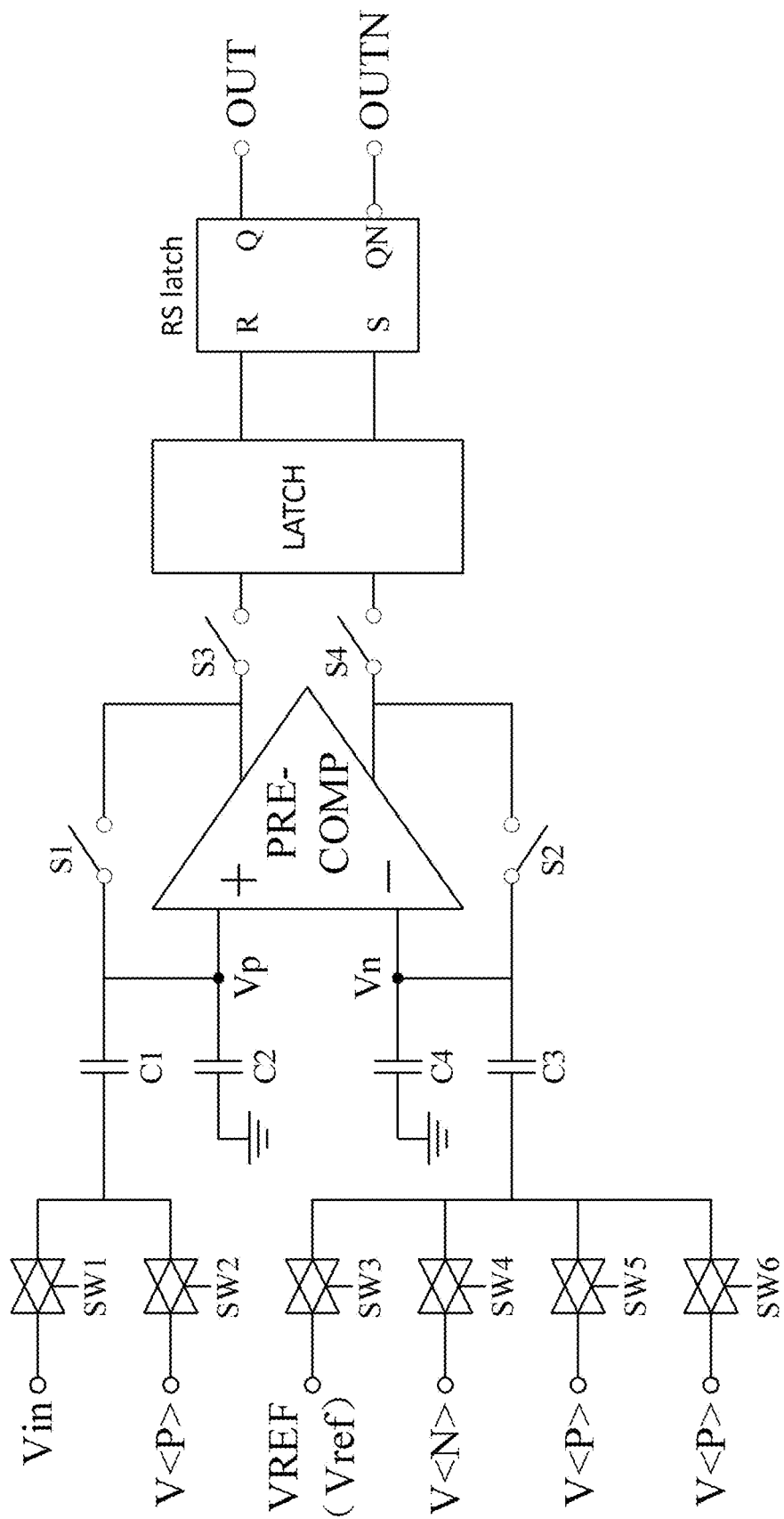
FIG. 4 is a schematic diagram of one comparator in a design example of the FLASH ADC according to another embodiment.

In one embodiment, as shown in FIG. 4, the comparator of the FLASH ADC module 12 further comprises a third pre-charge capacitor C2, a fourth pre-charge capacitor C4 and branch switches SW1-SW6. One terminal of the third pre-charge capacitor C2 is connected to the positive input terminal of the comparator pre-amplifier stage PRE-COMP, and the other terminal of the third pre-charge capacitor C2 is grounded. One terminal of the fourth pre-charge capacitor C4 is connected to the negative input terminal of the comparator pre-amplifier stage PRE-COMP, and the other terminal of the fourth pre-charge capacitor C4 is grounded. One terminal of the branch switch SW1 is connected to the other terminal of the first pre-charge capacitor C1, and the other terminal of the branch switch SW1 allows the input signal Vin to be input thereto. One terminal of the branch SW2 is connected to the other terminal of the first pre-charge capacitor C1, and the other terminal of the branch switch SW2 is connected to a resistor at a positive terminal of the resistor-string voltage dividing circuit.

One terminal of the branch switch SW3 is connected to the other terminal of the second pre-charge capacitor C3, and the other terminal of the branch switch SW3 allows the reference voltage to be input thereto. One terminal of the branch switch SW4 is connected to the other terminal of the second pre-charge capacitor C3, and the other terminal of the branch switch SW4 is connected to a resistor at a negative terminal of the resistor-string voltage dividing circuit. One terminal of the branch switch SW5 is connected to the other terminal of the second pre-charge capacitor C3, and the other terminal of the branch switch SW5 is connected to the resistor at the positive terminal of the resistor-string voltage dividing circuit. One terminal of the branch switch SW6 is connected to the other terminal of the second pre-charge capacitor C3, and the other terminal of the branch switch SW6 is connected to the resistor at the positive terminal of the resistor-string voltage dividing circuit.

Further, in this embodiment, a third pre-charge capacitor C2 and a fourth pre-charge capacitor C4 are also arranged in the circuit of the comparator module of the FLASH ADC module 12, and branch switches SW1-SW6 corresponding to different inputs are arranged in the circuit, wherein the third pre-charge capacitor C2 and the fourth pre-charge capacitor C4 are added to reduce the change of the common-mode voltage to reduce the adverse impact of the change of the common-mode voltage on the operation of the comparator module. The switch 01 and the switch 02 at the input terminal in FIG. 3 are respectively extended into corresponding branch switches SW. The branch switches SW1-SW6 ensure that the input signal Vin, the reference voltage and the partial voltage on a resistor string of the reference voltage can be input to the comparator module accurately and efficiency at different working stages, and are configured to support comparation and output operations of the comparator pre-amplifier stage PRE-COMP, the LATCH and the RS latch.

By means of the further optimal design of the circuit of the comparator module of the FLASH ADC module 12, the conversion performance of the FLASH ADC module 12 can be further improved.

In one embodiment, the reference voltage is a first reference voltage VREF; wherein, the first reference voltage VREF does not exceed a supply voltage VDD, and the voltage range of the input signal Vin is [0, VREF]. In a case where the first reference voltage VREF is adopted, the FLASH ADC module 12 samples a partial voltage of the reference voltage at the conversion stage, and the partial voltage of the first reference voltage VREF (the same as that at the conversion stage) and the input signal Vin are input to the negative terminal and the positive terminal of the FLASH ADC module 12 respectively at the sampling stage;

In the case where first reference voltage VREF is adopted, all sampling capacitors of the SAR ADC module 14 sample the input signal Vin at the sampling stage.

It can be understood that, in actual application, in the first reference mode, the negative input terminal (N terminal) of the comparator module of the FLASH ADC module 12 just needs to sample a partial voltage (marked as V<P>), on a resistor string at the positive terminal, of the first reference voltage VREF, and neither a partial voltage (marked as V<N>), on a resistor ring at the negative terminal, of the first reference voltage VREF nor the first reference voltage VREF participates in sampling input.

In one embodiment, the reference voltage is a second reference voltage Vref; wherein, the second reference voltage Vref does not exceed half of the supply voltage VDD, and the voltage range of the input signal Vin is [0, 2Vref];

That is, in an operating mode adopting the second reference voltage Vref, the range of the input signal of the ADC is [0, 2Vref]. In a case where the second reference voltage Vref is adopted, the FLASH ADC module 12 samples a partial voltage of the second reference voltage Vref at the conversion stage, and the second reference voltage Vref and the input signal Vin are input to the positive terminal and the negative terminal of the FLASH ADC module 12 respectively at the sampling stage, and half of the sampling capacitors of the SAR ADC module 14 sample the input signal Vin.

It can be understood that, in actual application, in the second reference mode, Vref≤VDD/2. In the second reference mode, the negative input terminal (N terminal) of the comparator module of the FLASH ADC module 12 needs to sample Vref and the partial voltage (V<N>) on the resistor string at the negative terminal, of Vref at different times, and the partial voltage V<P> on the resistor string at the positive terminal does not participate in sampling input.

In one embodiment, to gain a better understanding of the above solution, an optional design application example is provided. It should be noted that this example is merely illustrative and is not a unique one of the above solution in actual application. Those skilled in the art can obtain different design applications according to the design concept of the above solution.

A 12-bit single-terminal FLASH-SAR ADC circuit is designed and supports two reference modes:

First reference mode: the reference voltage is VREF, the voltage range of the input signal is 0-VREF, and VREF≤VDD;

Second reference mode: the reference voltage is Vref, the voltage range of the input signal is 0-2·Vref, and Vref≤VDD/2.

In this example, the 12-bit ADC has five high bits and seven low bits. That is, the FLASH ADC module 12 is responsible for coarse quantization of the five high bits, and the SAR ADC module 14 is responsible for fine quantization of the seven low bits. The design structure can be the same as that in FIG. 2.

According to the new combined operating sequence proposed in the application, the design of the FLASH ADC is optimized, for example, the FLASH ADC mainly comprises a resistor-string voltage dividing circuit formed by 32 resistors and the circuit of 31 comparator modules. The structure of the key circuit, namely the circuit of one comparator module, is shown in FIG. 4, wherein the four capacitors are identical and all have a capacitance C. VREF (Vref) is the reference voltage, V<P> and V<N> are partial voltages obtained by dividing the reference voltage VREF by a resistor string formed by 32 resistors, and a general formula of V<P> and V<N> is:

$$V<i> = \frac{i}{31} V_{REF}, i = 1, 2, \ldots, 31$$

P and N satisfy P+N=32, P=1, 2, . . . , 31; N=31, 30, . . . , 1, and $V_{REF}$ represents the value of VREF.

In different reference modes, the working principles of the FLASH ADC module 12 are different. Specifically:

1. In the first reference mode, the reference voltage is VREF, and the input range is 0-VREF:

In the first reference mode, the negative input terminal (N terminal) of the circuit of the comparator module of the FLASH ADC module 12 just needs to sample V<P>, and the branch switches SW3 and SW4 corresponding to V<N> and VREF are normally off.

At the FLASH ADC reset stage, SW2 and SW6 are at a high voltage level, and the corresponding potential is accessed to the bottom plates of the capacitors; at this moment, S1 is at a high voltage level, the input and output terminals of the comparator pre-amplifier stage PRE-COMP are short-connected to provide common-mode voltages $V_p^+$ and $V_n^+$ for the pre-charge capacitors. At this moment, charges stored in the capacitors at the P terminal and the N terminal of the comparator pre-amplifier stage PRE-COMP are respectively:

$$Q_P^+ = (V_p^+ - V<P>)C_1 + V_p^+ C_2$$

$$Q_N^+ = (V_n^+ - V<P>)C_3 + V_n^+ C_4$$

Where, $C_1$ represents the capacitance of the capacitor C1, $C_2$ represents the capacitance of the capacitor C2, $C_3$ represents the capacitance of the capacitor C3, and $C_4$ represents the capacitance of the capacitor C4. At the FLASH ADC conversion stage, SW1 and SW2 are at a high voltage level, the sampling input Vin and the voltage V<P> are accessed to the bottom plates of the capacitors, at this moment, S1 is at a low voltage level, and the input and output terminals of the comparator pre-amplifier stage PRE-COMP are disconnected to compare and amplify an input differential signal. At this moment, charges stored in the capacitors at the P terminal and the N terminal of the comparator pre-amplifier stage PRE-COMP are respectively:

$$Q_P^- = (V_p^- - V_{in})C_1 + V_p^- C_2$$

$$Q_N^- = (V_n^- - V<P>)C_3 + V_n^- C_4$$

Where, $V_{in}$ represents the value of Vin. According to the law of conservation of charge, $Q_P^+ = Q_P^-$, $Q_N^+ = Q_N^-$, and the above equations are combined to obtain:

$$2V_p^+ - V<P> = 2V_p^- - V_{in}$$

$$2V_n^+ - V<P> = 2V_n^- - V<P>$$

The comparator is of a fully differential structure, so $V_p^+ = V_n^+$. The two equations are subtracted and simplified to obtain:

$$2(V_p^- - V_n^-) = V_{in} - V<P>$$

The relationship between the input voltage Vin and the reference voltage V<P> can be determined according to the relation deduced above. When $V_p^- > V_n^-$, the input voltage Vin is greater than the reference voltage V<P>, the capacitor outputs 1; otherwise, when $V_p^- < V_n^-$, the input voltage Vin is less than the reference voltage V<P>, the capacitor outputs 0.

2. In a second reference mode, the reference voltage is Vref, and the input range is 0-2·Vref.

In the second reference mode, the negative input terminal (N terminal) of the comparator module of the FLASH ADC module 12 needs to sample Vref and V<N> at different times, and the branch switches SW5 and SW6 corresponding to V<P> are normally off.

At the FLASH ADC reset stage, SW2 and SW4 are at a high voltage level, and the corresponding potential is accessed to the bottom plates of the capacitors; at this moment, S1 is at a high voltage level, the input and output terminals of the comparator pre-amplifier stage PRE-COMP are short-connected to provide common-mode voltages $V_p^+$ and $V_n^+$ for the pre-charge capacitors. At this moment, charges stored in the capacitors at the P terminal and the N terminal are respectively:

$$Q_P^+ = (V_p^+ - V<P>)C_1 + V_p^+ C_2$$
$$Q_N^+ = (V_n^+ - V<N>)C_3 + V_n^+ C_4$$

At the FLASH ADC conversion stage, SW1 and SW3 are at a high voltage level, the external input Vin and the reference voltage Vref are accessed to the bottom plates of the capacitors, at this moment, S1 is at a low voltage level, and the input and output terminals of the comparator pre-amplifier stage PRE-COMP are disconnected to compare and amplify an input differential signal. At this moment, charges stored in the capacitors at the P terminal and the N terminal are respectively:

$$Q_P^- = (V_p^- - V_{in})C_1 + V_p^- C_2$$
$$Q_N^- = (V_n^- - V_{ref})C_3 + V_n^- C_4$$

Where, $V_{ref}$ represents the value of Vref. According to the law of conservation of charge, $Q_P^+ = Q_P^-$, $Q_N^+ = Q_N^-$. The above equations are combined to obtain:

$$2V_p^+ - V<P> = 2V_p^- - V_{in}$$
$$2V_n^+ - V<N> = 2V_n^- - V_{ref}$$

The comparator is of a fully differential structure, so $V_p^+ = V_n^+$. The two equations are subtracted and simplified to obtain:

$$2(V_p^- - V_n^-) = (V_{in} - V_{ref}) - (V<N> - V<P>)$$

In the second reference mode, the FLASH ADC operates in a fully differential mode, and the range of the input voltage of the ADC is 0-2·Vref; "$V_{in} - V_{ref}$" obtained by decreasing the input voltage Vin by Vref in the FLASH ADC is used as a new input voltage, the corresponding range of which is −Vref-Vref; a new reference voltage in the FLASH ADC is "V<N>−V<P>", the corresponding range of which is also −Vref-Vref.

The comparator compares the new input voltage "$V_{in} - V_{ref}$" with the new reference voltage "V<N>−V<P>". When $V_p^- > V_n^-$, it indicates that the new input voltage is greater than the new reference voltage, the comparator outputs 1. Otherwise, when $V_p^- < V_p^-$, it indicates that the new input voltage is less than the new reference voltage, the comparator outputs 0.

In the two reference modes, on the falling edge of the sampling clock, the switch S2 will be turned on to allow a result of the comparator pre-amplifier stage to be sent to the LATCH stage to be further compared and amplified and finally be sent to the RS latch to be latched to remain unchanged in the whole SAR ADC fine quantization process.

Figure 5:
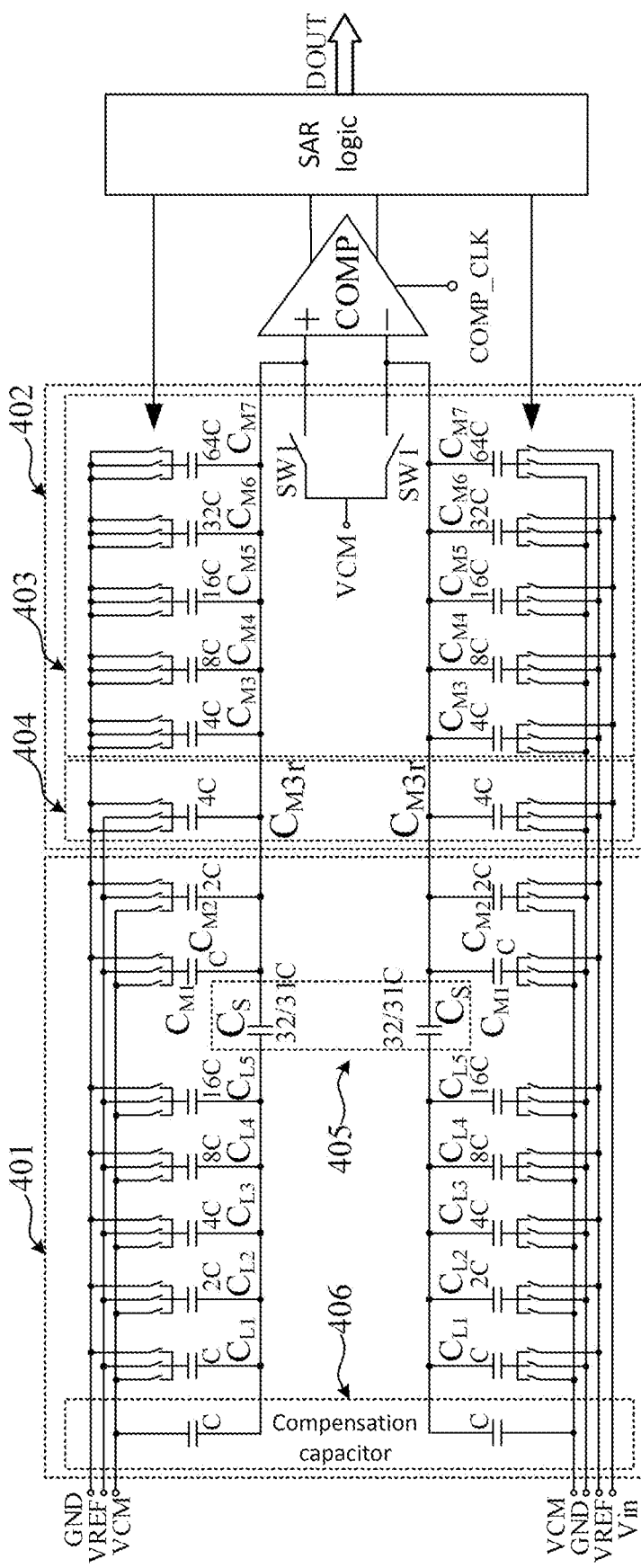
FIG. 5 is a structural diagram of a design example of a SAR ADC according to one embodiment.

The SAR ADC module 14 is responsible for quantization of the seven low bits and should support switching of the above two reference modes, and the structural diagram of the SAR ADC module 14 is shown in FIG. 5. The DAC in the SAR ADC module 14 is of a two-segment structure (the P terminal and the N terminal are symmetrical) and is divided into two segments by a bridging capacitor 405 (Cs), wherein a first segment has 8 bits (including a sampling capacitor array 402 and capacitors $C_{M1}$ and $C_{M2}$) which are 64C, 32C, 16C, 8C, 4C, 4C, 2C and C respectively, and comprises a redundant-bit capacitor 404 with a capacitance 4C; and a second segment has 6 (5+1) bits which are 16C, 8C, 4C, 2C, C and C respectively, and the last C is a terminal compensation capacitor which does not participate in conversion. The bridging capacitor 405 satisfies $$C_s = \frac{32}{31}C.$$

The SAR ADC module 14 adopts the sampling capacitor array 402 for bottom-plate sampling and is a single-terminal sampling structure, that is, only the sampling capacitors at the N terminal of the sampling capacitor array 402 (the negative input terminal of the comparator) of the DAC sample the input signal;

During sampling of the P terminal of the sampling capacitor array 402 (the positive input terminal of the comparator) of the DAC, the bottom plates of the corresponding capacitors are all grounded (GND). The bottom plates of the other capacitors 401 (a non-sampling capacitor array) are connected to a common-mode voltage VCM during sampling, and do not participate in sampling. The bottom plate of the compensation capacitor 406 is always connected to the common-mode voltage VCM. Sampling capacitors are capacitors participating in signal sampling.

Figure 6:
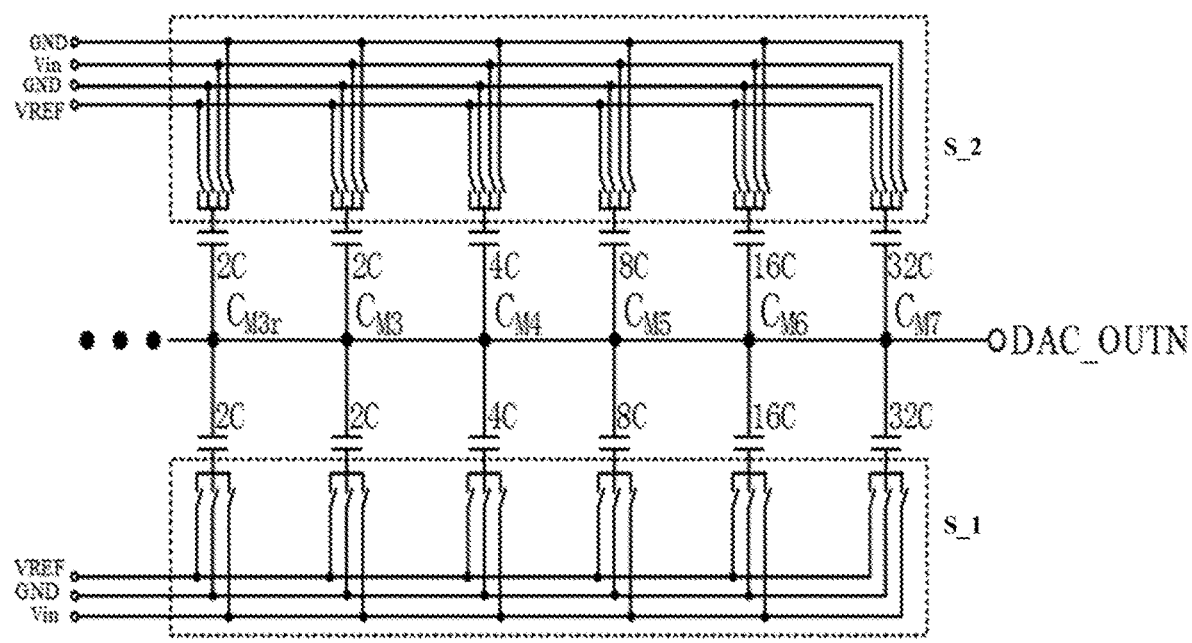
FIG. 6 is a principle diagram of dual-mode sampling of CDAC high-bit sampling capacitors in a design example of the SAR ADC according to one embodiment.

The DAC also supports the above two reference modes, and the sampling capacitors (the sampling capacitor array 402) need to be specially designed. As shown in FIG. 6, each capacitor is averagely divided into two parts, and all the capacitors are reclassified into two groups, and sampling switches of the bottom plates of one group of capacitors (switches for controlling the connection between the bottom plates of the capacitors and inputs) are controlled by a first change-over switch S_1, sampling switches of the bottom plates of the other groups of capacitors is controlled by a second change-over switch S_2, and in the group of capacitors controlled by the second change-over switch S_2, a grounding control switch corresponding to each capacitor needs to be added to the change-over switch.

In the first reference mode, all the capacitors sample the input signal, that is, the first change-over change S_1 and the second change-over switch S_2 are both at a high voltage level (the high voltage level is valid), at this moment, the sampling capacitance is 128C, the sampling charge is 128C·$V_{in}$, and the range of the input voltage is 0-VREF.

Figure 7A:
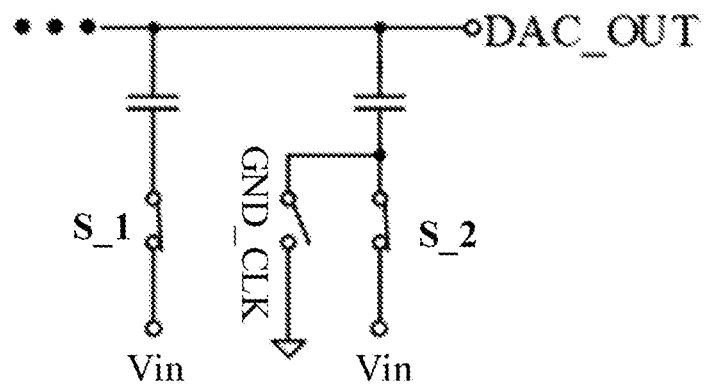
Figure 7B:
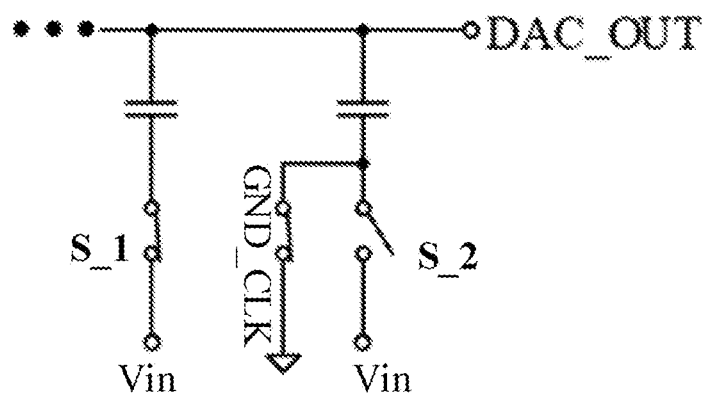

In the second reference mode, the first change-over change S_1 and the second change-over switch S_2 are both at a low voltage level, only the group of capacitors corresponding to the first change-over change S_1 participate in sampling, and the grounding control switches GND_CLK of the group of capacitors corresponding to the second change-over switch S_2 are all turned on during sampling to allow this group of capacitors to be grounded and not participate in sampling. At this moment, the sampling capacitance is only 64C, and the sampling charge is only 64C·Vin. In the subsequent ADC quantization process, all 128C capacitors in 402 will participate, and charges collected by 64C sampling capacitors will be allocated to the 128C capacitors, and the equivalent sampling voltage is U=Q/C=64C·Vin/128C=0.5·Vin. Because the subsequent ADC quantization uses Vref as reference, the range of the input voltage can be 0~2·Vref. The sampling diagrams in the two modes are shown in FIG. 7A and FIG. 7B, wherein FIG. 7A illustrates sampling in the first reference mode, and FIG. 7B illustrates sampling in the second reference mode.

In FIG. 5, the five high bits correspond to capacitors 403. In order to correspond to the output of the FLASH ADC module 12, all capacitors 403 are averagely allocated with 2C as the base unit, and there are 62 capacitors in total, wherein there are 31 capacitors in the group controlled by the first change-over switch S_1, there are 31 capacitors in the group controlled by the second change-over switch S_2, and conversion control signals of the two groups of capacitors are both controlled by a 31-bit temperature control code given by the FLASH ADC module (that is, the capacitance controlled by one temperature code is 4C).

For example, in the first reference mode, the SAR ADC module 14 samples the input signal $V_{in}$ when entering the sampling stage, and at this moment, the charges of the P terminal and the N terminal are calculated respectively:

$$Q_P^1 = V_{CM}128C$$

$$Q_P^1 = (V_{CM} - V_{in})128C$$

Where, $V_{CM}$ represents the value of the common-mode voltage VCM.

At the SAR ADC quantization stage, to facilitate calculation, the temperature code output by the FLASH ADC module 12 is converted into five digital codes, which are D13, D12, D11, D10 and D9 respectively. In this design, only one terminal is used for sampling, and the P terminal is kept grounded, so the output result of the FLASH ADC module 12 only controls the five high bits of the N terminal of the CDAC in the SAR ADC module 14, and the five high bits of the P terminal of the CDAC are kept grounded. After the temperature code is transmitted to the CDAC, corresponding charges of the P terminal and the N terminal are:

$$Q_P^2 = 132CV_{XP1} - 4V_{CM}$$

$$Q_N^2 = 132CV_{XV1} - (D_{13}64C + D_{12}32C + D_{11}16C + D_{10}8C + D_9 4C)V_{REF} - 4V_{CM}$$

Where, $V_{XP1}$ is an input voltage of the positive terminal (P terminal) of the comparator COMP in FIG. 5, and $V_{XN1}$ is an input voltage of the negative terminal (N terminal) of the comparator COMP in FIG. 5.

According to the law of conservation of charge $Q_P^1 = Q_P^2$, $Q_N^1 = Q_N^2$, $V_{XP1}$ and $V_{XN1}$ can be resolved:

$$V_{XP1} = V_{CM}$$

$$V_{XN1} = V_{CM} - \frac{128}{132}V_{in} + \sum_{i=1}^{5} D_{14-i} 2^{7-i} \frac{V_{REF}}{132}$$

The two equations are subtracted to obtain:

$$V_{XP1} - V_{XV1} = \frac{128}{132}\left(V_{in} - \sum_{i=1}^{5} D_{14-i} 2^{7-i} \frac{V_{REF}}{128}\right)$$

According to the above equation, the comparator COMP in FIG. 5 compares $V_{XP1}$ with $V_{XN1}$ to obtain a first quantization result of the SAR ADC module 14.

If $V_{XP1} > V_{XN1}$, the comparator outputs 1, the bottom plate of the N terminal $C_{M3r}$ of the capacitor corresponding to the next bit is connected to VREF, and the bottom plate of the P terminal CM3r of the capacitor is grounded GND. If $V_{XP1} < V_{XN1}$, the comparator outputs 0, the bottom plate of the N terminal CM3r of the capacitor corresponding to the next bit is grounded, and the bottom plate of P terminal CM3r of the capacitor is connected to VREF.

Every time switching is performed later, the voltage difference of the output terminal of the CDAC can be deduced according to the law of conservation of charge:

$$V_{XP_j} - V_{XN_j} = \frac{128}{132}\left[(V_{XP_{j-1}} - V_{XV_{j-1}}) \pm \frac{k}{128}V_{REF}\right]$$

Where, k=4−j, and j=2, 3 . . . , 9. When the comparison result of the $(j-1)^{th}$ bit is 0, subtraction is adopted in the above equation; when the comparison result of the $(j-1)^{th}$ bit is 1, addition is adopted in the above equation. According to the comparison result of $V_{XPj}$ and $V_{XNj}$, the next bit is controlled to switch in the same way as mentioned above until quantization of the (N-M) bits is completed.

The deduction and calculation of the SAR ADC in the second reference mode are the identical with the deduction and calculation of the SAR ADC in the first reference mode, and will not be repeated here. After SAR ADC quantization is completed, the temperature code output by the FLASH ADC module 12 is converted into a binary code, and is subjected to redundant bit encoding together with the SAR ADC quantization result to finally obtain a 12-bit output code, such that ADC conversion is completed.

Figure 8:
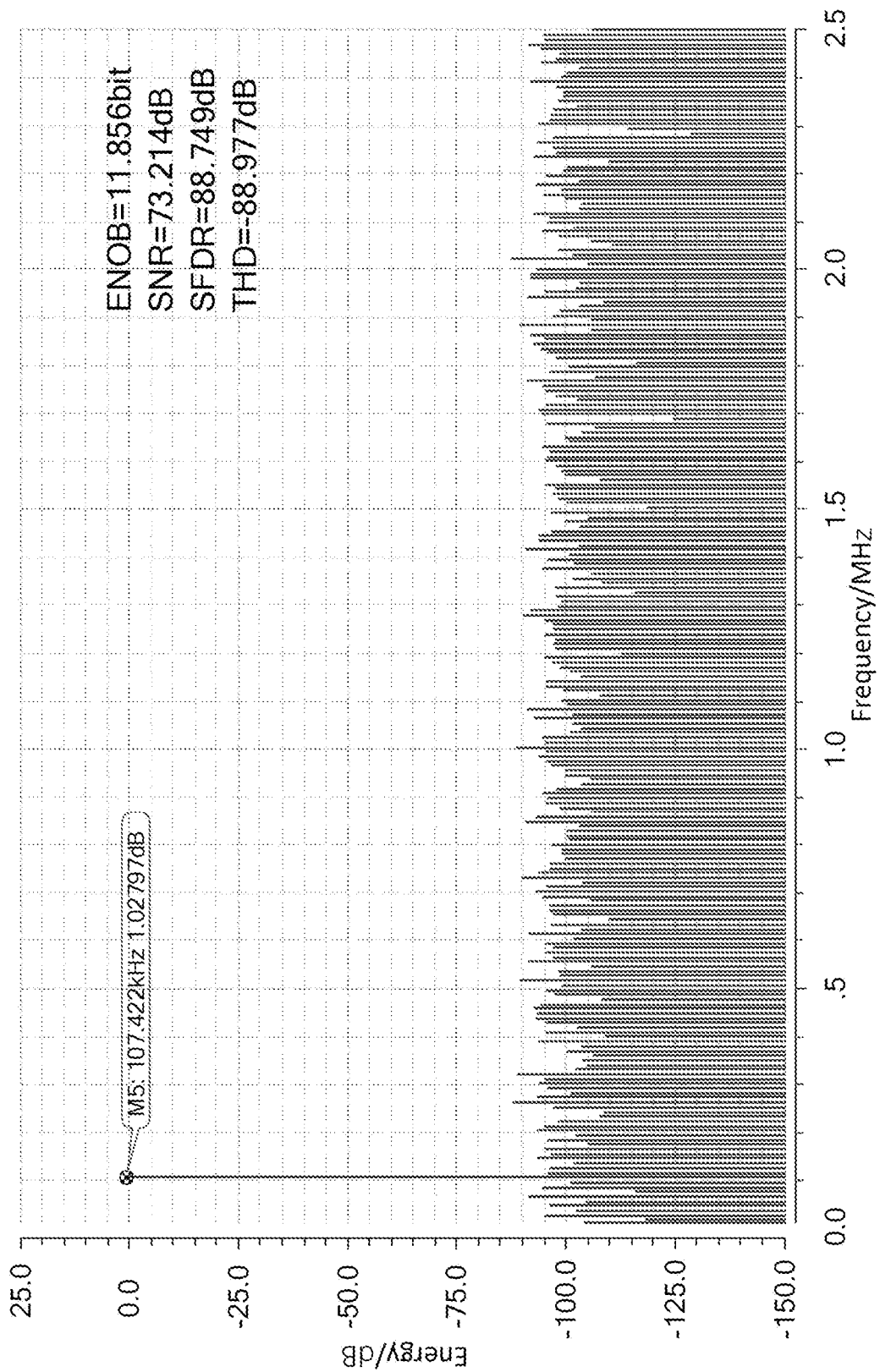
FIG. 8 illustrates a simulation result of a design example in a first reference mode according to one embodiment.
Figure 9:
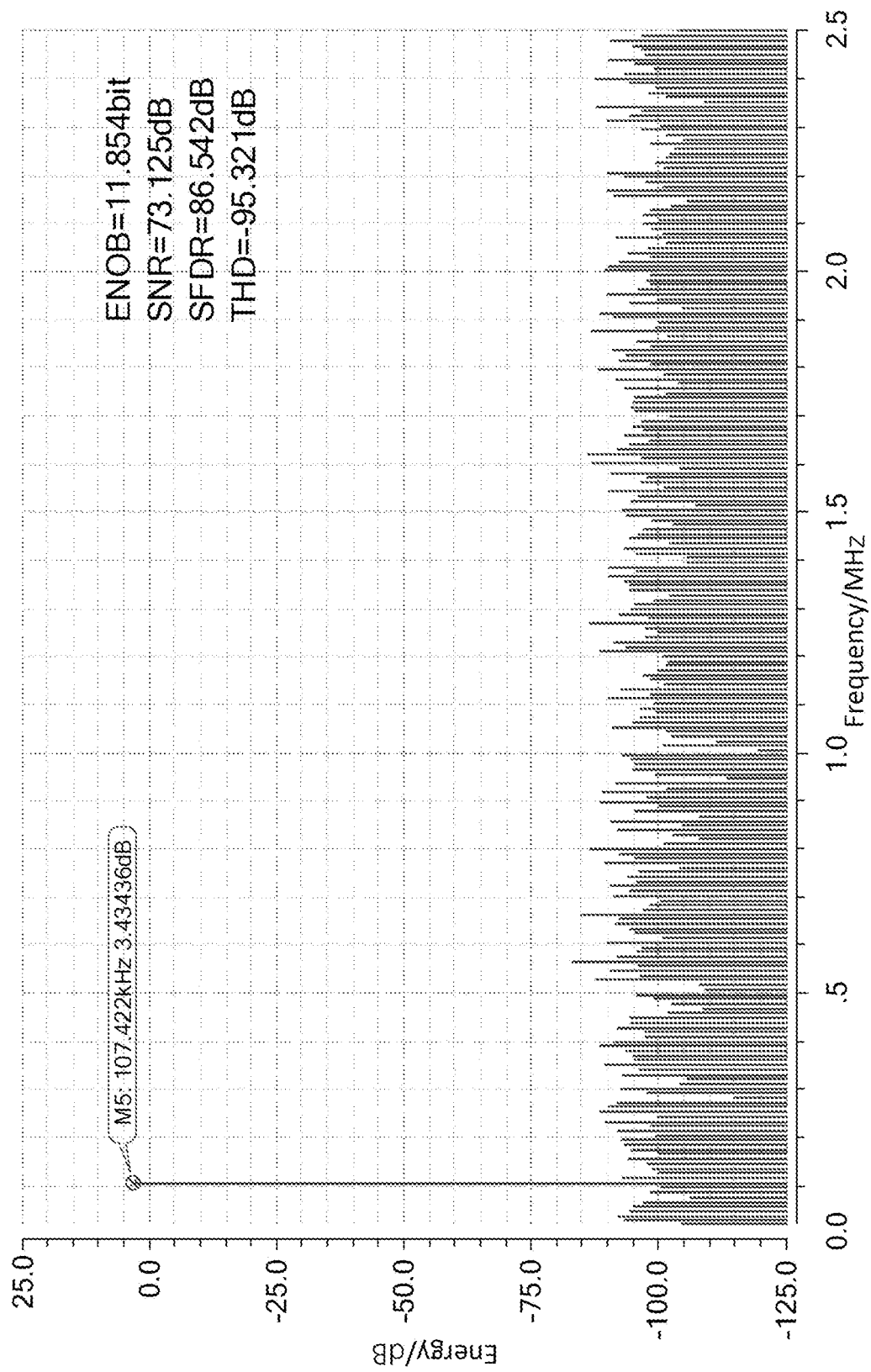
FIG. 9 illustrates a simulation result of a design example in a second reference mode according to another embodiment.

At this point, the design example is expounded completely. Finally, the circuit in the above example can be established in Cadence application to carry out a simulation test, and simulation results are shown in FIG. 8 and FIG. 9. The effective number of bits ENOB in the first reference mode can reach 11.856 bit, and the effective number of bits ENOB in the second reference mode can reach 11.854 bit. Wherein, SNR represents the signal to noise ratio, SFDR represents the spurious free dynamic range, and THD represents the total harmonic distortion.

Figure 10:
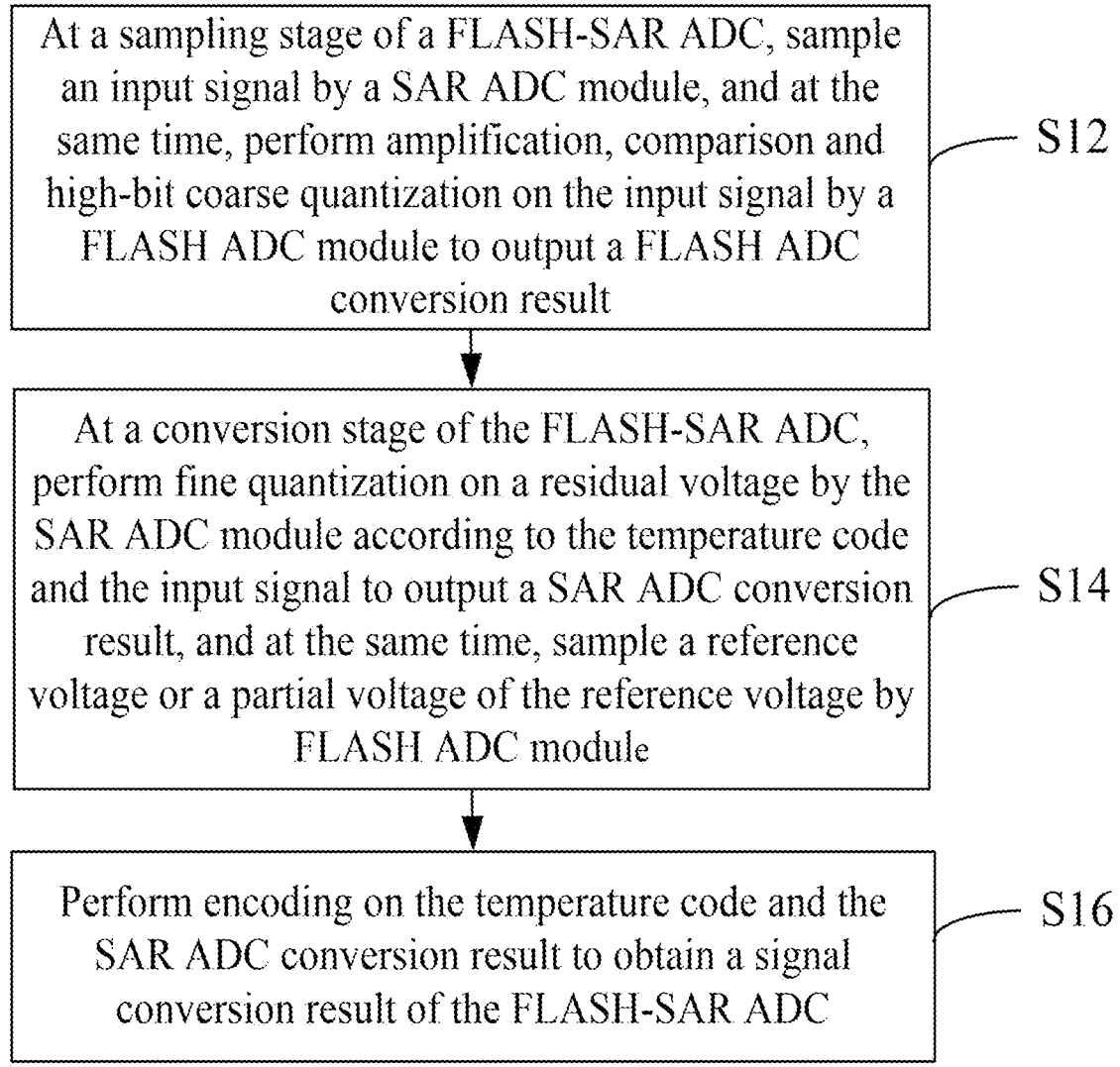
FIG. 10 is a flow diagram of a FLASH-SAR ADC conversion method according to one embodiment.

As shown in FIG. 10, one embodiment of the application further provides a FLASH-SAR ADC conversion method, comprising steps S12 to S16:

S12: at a sampling stage of a FLASH-SAR ADC, sampling an input signal by a SAR ADC module, and at the same time, performing amplification, comparison and high-bit coarse quantization on the input signal by a FLASH ADC module to output a FLASH ADC conversion result, wherein the FLASH ADC conversion result is a temperature code;

S14: at a conversion stage of the FLASH-SAR ADC, performing fine quantization on a residual voltage by the SAR ADC module according to the temperature code and the input signal to output a SAR ADC conversion result, and at the same time, sampling a reference voltage or a partial voltage of the reference voltage by the FLASH ADC module; and S16: performing encoding on the temperature code and the SAR ADC conversion result to obtain a signal conversion result of the FLASH-SAR ADC.

It can be understood that the explanation and description of the steps in this embodiment can be understood with reference to corresponding parts in the embodiment of the FLASH-SAR ADC circuit 100, and will not be repeated here.

According to the FLASH-SAR ADC conversion method, at the sampling stage of the FLASH-SAR ADC circuit, when the SAR ADC module samples an input signal, the FLASH ADC module performs amplification, comparison and high-bit coarse quantization on the input signal to output a FLASH ADC conversion result in the form of a temperature code. The conversion stage is started when the sampling stage is ended, and at the conversion stage of the FLASH-SAR ADC circuit, the SAR ADC module performs fine quantization on a residual voltage according to the temperature code and the input signal to output a SAR ADC conversion result, and at the same time, the FLASH ADC module samples a reference voltage or a partial voltage of the reference voltage. In this way, the operating sequence of the FLASH-SAR ADC is optimized, and FLASH ADC quantization is completed at the same time as ADC sampling and will not occupy an independent clock cycle, thus increasing the conversion speed of the entire ADC and reducing errors caused by the aperture time and other undesired factors. Compared with the traditional FLASH ADC processing method, the above solution solves the problem that a waste of time is caused because the quantization of a traditional FLASH ADC occupies one or more ADC clock cycles and a SAR ADC enters the hold stage and does not work when the FLASH ADC works, thus greatly improving the conversion efficiency.

In one embodiment, S12 may specifically comprise the following processing steps: when a sampling clock of the FLASH-SAR ADC is valid, sampling the input signal by the SAR ADC module; and on a rising edge of the sampling clock, switching a comparator pre-amplifier stage in the FLASH ADC module from a reset state for sampling the reference voltage to an amplification state to amplify the input signal;

on a falling edge of the sampling clock, transmitting, by the comparator pre-amplifier stage in the FLASH ADC module, a pre-amplifier stage result to a latch in the FLASH ADC module for processing, and converting and outputting a comparison result obtained by the latch in the FLASH ADC module by means of an RS latch in the FLASH ADC module to obtain the temperature code; and after the comparator pre-amplifier stage in the FLASH ADC module transmits the pre-amplifier stage result to the latch in the FLASH ADC module, switching the comparator pre-amplifier stage in the FLASH ADC module to the reset state.

In one embodiment, the process of performing, at a conversion stage of the FLASH-SAR ADC, fine quantization on a residual voltage by the SAR ADC module according to the temperature code and the input signal to output a SAR ADC conversion result in S14 may specifically comprise the following steps: when the sampling clock of the FLASH-SAR ADC turns invalid, switching a CDAC in the SAR ADC module to a current bit according to the temperature code;

after the CDAC is switched to the current bit, transmitting the pre-amplifier stage result based on the input signal to a latch in the SAR ADC module for processing when a latch clock of a comparator in the SAR ADC module is valid, to output a residual voltage fine quantization result of the current bit;

feeding the residual voltage fine quantization result of the current bit back to a capacitor corresponding to a next bit of the CDAC in the SAR ADC module, and switching the CDAC in the SAR ADC module to the next bit according to the temperature code;

after the CDAC is switched to the next bit, transmitting the pre-amplifier stage result based on the input signal to the latch in the SAR ADC module for processing when the latch clock of the comparator in the SAR ADC module is valid, to output a residual voltage fine quantization result of the next bit; and when residual voltage fine quantization of all bits of the SAR ADC module is completed, outputting the SAR ADC conversion result.

In one embodiment, the reference voltage is a first reference voltage VREF; wherein, the first reference voltage VREF does not exceed a supply voltage, and the voltage range of the input signal Vin is [0, VREF]. In a case where the first reference voltage VREF is adopted, the FLASH ADC module samples a partial voltage of the reference voltage at the conversion stage, and the partial voltage of the first reference voltage VREF and the input signal are input to a negative terminal and a positive terminal of the FLASH ADC module respectively at the sampling stage.

In one embodiment, the reference voltage is a second reference voltage Vref. Wherein, the second reference voltage Vref does not exceed half of the supply voltage, and the voltage range of the input signal Vin is [0, 2Vref]. In a case where the second reference voltage Vref is adopted, the FLASH ADC module samples a partial voltage of the second reference voltage Vref at the conversion stage, and the second reference voltage Vref and the input signal are input to the positive terminal and the negative terminal of the FLASH ADC module respectively at the sampling stage, and half of the sampling capacitors of the SAR ADC module sample the input signal.

It can be understood that the explanation and description of the embodiments of the FLASH-SAR ADC method can be understood with reference to corresponding explanations and descriptions of the embodiments of the FLASH-SAR ADC circuit 100, and will not be repeated here.

The technical features in the above embodiments can be combined freely. For the sake of a brief description, not all possible combinations of the technical features in the above embodiments are described, and all combinations of these technical features obtained without conflicts should be construed as falling within the scope of this specification. The above embodiments merely illustrate some implementations of the application, and are specifically described in detail, but they should not be construed as limitations of the patent scope of the invention. It should be pointed out that those ordinarily skilled in the art can make some modifications and improvements without departing from the concept of the application, and all these modifications and improvements should fall within the protection scope of the application. Therefore, the patent protection scope of the application should be defined by the appended claims.

What is claimed is:

1. A FLASH-SAR ADC conversion method, characterized in that comprising:
   when a sampling clock of a FLASH-SAR ADC is valid, sampling an input signal by a SAR ADC module;
   on a rising edge of the sampling clock, switching a comparator pre-amplifier stage in a FLASH ADC module from a reset state for sampling a reference voltage to an amplification state, to amplify the input signal;
   on a falling edge of the sampling clock, transmitting, by the comparator pre-amplifier in the FLASH ADC module, a pre-amplifier stage result to a latch in the FLASH ADC module, wherein the latch further amplifies the pre-amplifier stage result and output a comparison result to an RS latch in the FLASH ADC module, and the FLASH ADC module output a temperature code finally;
   after the comparator pre-amplifier in the FLASH ADC module transmits the pre-amplifier stage result to the latch in the FLASH ADC module, switching the comparator pre-amplifier to the reset state;
   at a conversion stage of the FLASH-SAR ADC, performing fine quantization on a residual voltage by the SAR ADC module according to the temperature code and the input signal to output an SAR ADC conversion result, and at the same time, sampling a reference voltage or a partial voltage of the reference voltage by the FLASH ADC module; and
   performing encoding on the temperature code and the SAR ADC conversion result to obtain a signal conversion result of the FLASH-SAR ADC.

2. The FLASH-SAR ADC conversion method according to claim 1, wherein the process of performing, at a conversion stage of the FLASH-SAR ADC, fine quantization on the residual voltage by the SAR ADC module according to the temperature code and the input signal to output an SAR ADC conversion result comprises:
   when the sampling clock of the FLASH-SAR ADC turns invalid, switching a CDAC in the SAR ADC module to a current bit according to the temperature code;
   after the CDAC is switched to the current bit, transmitting the pre-amplifier stage result based on the input signal to a latch in the SAR ADC module for processing when a latch clock of a comparator in the SAR ADC module is valid, to output a residual voltage fine quantization result of the current bit;
   feeding the residual voltage fine quantization result of the current bit back to a capacitor corresponding to a next bit of the CDAC in the SAR ADC module, and switching the CDAC in the SAR ADC module to the next bit according to the temperature code;
   after the CDAC is switched to the next bit, transmitting the pre-amplifier stage result based on the input signal to the latch in the SAR ADC module for processing when the latch clock of the comparator in the SAR ADC module is valid, to output a residual voltage fine quantization result of the next bit; and
   when residual voltage fine quantization of all bits of the SAR ADC module is completed, outputting the SAR ADC conversion result.

3. A FLASH-SAR ADC circuit, comprising a FLASH ADC module and a SAR ADC module, wherein sampling input terminals of the FLASH ADC module is used to access an input signal and a reference voltage to be input thereto respectively, an output terminal of the FLASH ADC module is connected to an input terminal of a CDAC circuit of the SAR ADC module and is also connected to a digital processing module, sampling input terminal of the SAR ADC module are used to access the input signal and the reference voltage to be input thereto respectively, and an output terminal of the SAR ADC module is connected to the digital processing module;
   when a sampling clock is valid, the SAR ADC module samples the input signal;
   on a rising edge of the sampling clock, a comparator pre-amplifier stage in the FLASH ADC module is switched from a reset state for sampling the reference voltage to an amplification state, to amplify the input signal;
   on a falling edge of the sampling clock, the comparator pre-amplifier in the FLASH ADC module transmits a pre-amplifier stage result to a latch in the FLASH ADC module for processing, and a comparison result obtained by the latch in the FLASH ADC module is converted and output by means of an RS latch in the FLASH ADC module, to obtain a temperature code;
   after transmitting the pre-amplifier stage result to the latch in the FLASH ADC module, the comparator pre-amplifier in the FLASH ADC module is switched to the reset state;
   at a conversion stage of the FLASH-SAR ADC circuit, the SAR ADC module performs fine quantization on a residual voltage according to the temperature code and the input signal to output an SAR ADC conversion result, and at the same time, the FLASH ADC module samples the reference voltage or a partial voltage of the reference voltage; and
   encoding is performed on the temperature code and the SAR ADC conversion result to obtain a signal conversion result of the FLASH-SAR ADC circuit.

4. The FLASH-SAR ADC circuit according to claim 3, wherein when the sampling clock of the FLASH-SAR ADC turns invalid, a CDAC in the SAR ADC module is switched to a current bit according to the temperature code;
   after the CDAC is switched to the current bit, the pre-amplifier stage result based on the input signal is transmitted to a latch in the SAR ADC module to be processed when a latch clock of a comparator in the SAR ADC module is valid, to output a residual voltage fine quantization result of the current bit;
   the residual voltage fine quantization result of the current bit is fed back to a capacitor corresponding to a next bit of the CDAC in the SAR ADC module, and the CDAC in the SAR ADC module is switched to the next bit according to the temperature code;
   after the CDAC is switched to the next bit, the pre-amplifier stage result based on the input signal is transmitted to the latch in the SAR ADC module to be processed when the latch clock of the comparator in the SAR ADC module is valid, to output a residual voltage fine quantization result of the next bit; and
   when residual voltage fine quantization of all bits of the SAR ADC module is completed, the SAR ADC conversion result is output.

5. The FLASH-SAR ADC circuit according to claim 4, wherein the reference voltage is a first reference voltage VREF; the first reference voltage VREF does not exceed a supply voltage, and a voltage range of the input signal is from zero to the first reference voltage VREF;
  in a case where the first reference voltage VREF is adopted, the FLASH ADC module samples the partial voltage of the reference voltage at the conversion stage, and a partial voltage of the first reference voltage VREF and the input signal are input to a positive terminal and a negative terminal of the FLASH ADC module respective at a sampling stage;
  in the case where the first reference voltage VREF is adopted, all sampling capacitors of the SAR ADC module samples the input signal at the sampling stage.

6. The FLASH-SAR ADC circuit according to claim 4, wherein the reference voltage is a second reference voltage Vref, wherein the second reference voltage Vref does not exceed half of a supply voltage, and a voltage range of the input signal is from zero to twice the second reference voltage Vref;
  in a case where the second reference voltage Vref is adopted, the FLASH ADC module samples a partial voltage of the second reference voltage Vref at the conversion stage, the second reference voltage Vref and the input signal are input to a positive terminal and a negative terminal of the FLASH ADC module respectively at sampling stage, and half of sampling capacitors of the SAR ADC module sample the input signal.

7. The FLASH-SAR ADC circuit according to claim 3, wherein the comparator of the FLASH ADC module comprises a comparator pre-amplifier stage, a latch, an RS latch, a first pre-charge capacitor, a second pre-charge capacitor, a first switch, a second switch, a third switch and a fourth switch;
  a positive input terminal of the comparator pre-amplifier stage is connected to one terminal of the first pre-charge capacitor, the other terminal of the first pre-charge capacitor allows the input signal to be input thereto or is connected to a resistor-string voltage dividing circuit, a negative input terminal of the comparator pre-amplifier stage is connected to one terminal of the second pre-charge capacitor, and the other terminal of the second pre-charge capacitor C3 allows the reference voltage to be input thereto or is connected to the resistor-string voltage dividing circuit;
  a positive output terminal of the comparator pre-amplifier stage is connected to a positive input terminal of the latch through the third switch, a negative output terminal of the comparator pre-amplifier stage is connected to a negative input terminal of the latch through the fourth switch, and the latch is in cascade connection with the RS latch;
  one terminal of the first switch is connected to the positive input terminal of the comparator pre-amplifier stage, and the other terminal of the first switch is connected to the positive output terminal of the comparator pre-amplifier stage;
  one terminal of the second switch is connected to the negative input terminal of the comparator pre-amplifier stage, and the other terminal of the second switch is connected to the negative output terminal of the comparator pre-amplifier stage.

8. The FLASH-SAR ADC circuit according to claim 7, wherein the comparator of the FLASH ADC module further comprises a third pre-charge capacitor, a fourth pre-charge capacitor and branch switches SW1~SW6, wherein one terminal of the third pre-charge capacitor is connected to the positive input terminal of the comparator pre-amplifier stage, the other terminal of the third pre-charge capacitor is grounded, one terminal of the fourth pre-charge capacitor is connected to the negative input terminal of the comparator pre-amplifier stage, and the other terminal of the fourth pre-charge capacitor is grounded;
  one terminal of the branch switch SW1 is connected to the other terminal of the first pre-charge capacitor, the other terminal of the branch switch SW1 allows the input signal Vin to be input thereto, one terminal of the branch SW2 is connected to the other terminal of the first pre-charge capacitor, and the other terminal of the branch switch SW2 is connected to a resistor at a positive terminal of the resistor-string voltage dividing circuit;
  one terminal of the branch switch SW3 is connected to the other terminal of the second pre-charge capacitor, the other terminal of the branch switch SW3 allows the reference voltage to be input thereto, one terminal of the branch switch SW4 is connected to the other terminal of the second pre-charge capacitor C3, the other terminal of the branch switch SW4 is connected to a resistor at a negative terminal of the resistor-string voltage dividing circuit, one terminal of the branch switch SW5 is connected to the other terminal of the second pre-charge capacitor, the other terminal of the branch switch SW5 is connected to the resistor at the positive terminal of the resistor-string voltage dividing circuit, one terminal of the branch switch SW6 is connected to the other terminal of the second pre-charge capacitor, and the other terminal of the branch switch SW6 is connected to the resistor at the positive terminal of the resistor-string voltage dividing circuit.

* * * * *